United States Patent
Nakamura et al.

(10) Patent No.: US 9,899,983 B2
(45) Date of Patent: Feb. 20, 2018

(54) ELECTRONIC CONTROL UNIT

(71) Applicant: NISSIN KOGYO CO., LTD., Ueda, Nagano (JP)

(72) Inventors: Motoyasu Nakamura, Nagano (JP); Tetsuo Kobori, Nagano (JP); Sotaro Kanai, Nagano (JP); Sekihei Shimozono, Nagano (JP); Kouji Sakai, Nagano (JP)

(73) Assignee: AUTOLIV NISSIN BRAKE SYSTEMS JAPAN CO., LTD., Nagano (JP)

( * ) Notice: Subject to any disclaimer, the term of this patent is extended or adjusted under 35 U.S.C. 154(b) by 135 days.

(21) Appl. No.: 14/969,868

(22) Filed: Dec. 15, 2015

(65) Prior Publication Data
US 2016/0182002 A1 Jun. 23, 2016

(30) Foreign Application Priority Data

Dec. 17, 2014 (JP) ................ 2014-255289

(51) Int. Cl.
| H03H 7/01 | (2006.01) |
| H03H 1/00 | (2006.01) |
| H03H 7/42 | (2006.01) |
| B60T 13/14 | (2006.01) |
| B60T 13/66 | (2006.01) |
| B60T 13/68 | (2006.01) |
| H01F 17/06 | (2006.01) |

(Continued)

(52) U.S. Cl.
CPC ......... *H03H 1/0007* (2013.01); *B60T 13/146* (2013.01); *B60T 13/662* (2013.01); *B60T 13/686* (2013.01); *H03H 7/0115* (2013.01); *H03H 7/427* (2013.01); *H01F 17/062* (2013.01); *H01F 27/2828* (2013.01); *H01F 2017/0093* (2013.01)

(58) Field of Classification Search
CPC ..... H03H 7/427; H03H 1/0007; H03H 7/0115
USPC ............... 333/12, 181, 185; 336/67, 90, 208
See application file for complete search history.

(56) References Cited

U.S. PATENT DOCUMENTS

| 5,306,974 A * | 4/1994 | Bates ................... H02K 11/026 310/220 |
| 5,793,273 A * | 8/1998 | Yamaguchi ............. H01F 17/04 333/181 |
| 2008/0129436 A1* | 6/2008 | Feist ..................... H01F 27/027 336/208 |

FOREIGN PATENT DOCUMENTS

| JP | H02068415 | 5/1990 |
| JP | H03128916 | 12/1991 |
| JP | 2006019582 | 1/2008 |

(Continued)

OTHER PUBLICATIONS

Japanese Office Action related in Application No. 2014-255289 dated Jun. 20, 2017, 6 pages.

*Primary Examiner* — Rakesh Patel
(74) *Attorney, Agent, or Firm* — Andrew M. Calderon; Roberts Mlotkowski Safran Cole & Calderon, P.C.

(57) ABSTRACT

One embodiment provides an electronic control unit. The electronic control unit includes a housing and a noise filter. The housing includes an accommodating portion, and the accommodating portion includes a support portion. The noise filter includes an engaging portion, and at least part of the noise filter is housed in the accommodating portion of the housing. When the at least part of the noise filter is housed in the accommodating portion of the housing, the engaging portion is in engagement with the support portion.

19 Claims, 9 Drawing Sheets

(51) Int. Cl.
 *H01F 27/28* (2006.01)
 *H01F 17/00* (2006.01)

(56) References Cited

FOREIGN PATENT DOCUMENTS

| | | |
|---|---|---|
| JP | 2010057258 | 3/2010 |
| JP | 2012156496 | 8/2012 |
| JP | 2013-069737 A | 4/2013 |

* cited by examiner

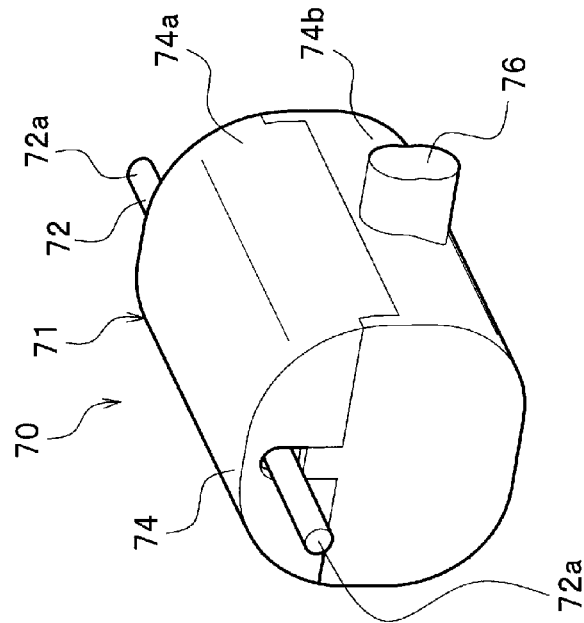
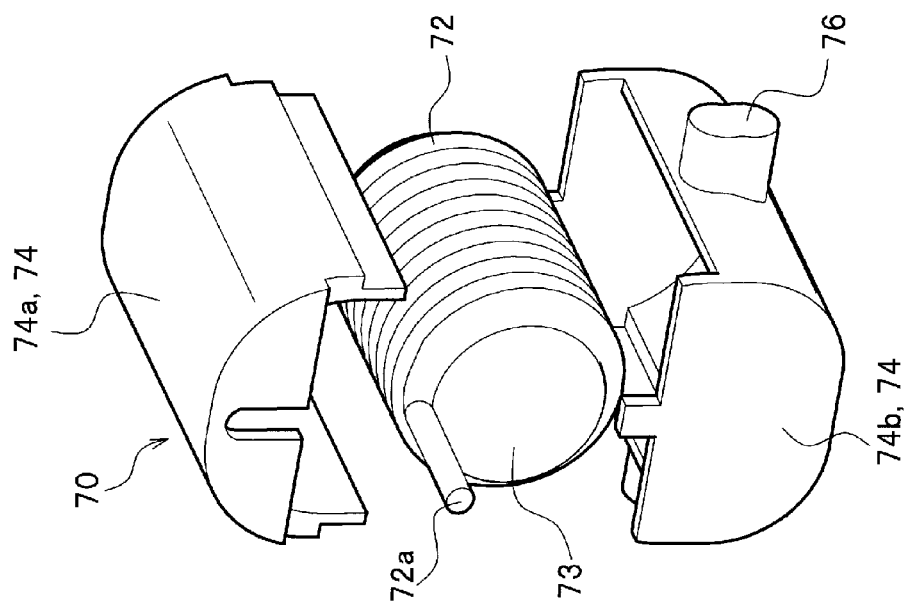
FIG. 9A
FIG. 9B

ELECTRONIC CONTROL UNIT

CROSS-REFERENCE TO RELATED APPLICATION(S)

This application claims priority from Japanese Patent Application No. 2014-255289 filed on Dec. 17, 2014, the entire contents of which are incorporated herein by reference.

FIELD

The present invention relates to an electronic control unit.

BACKGROUND

An electronic unit of a vehicle brake fluid pressure control system may include a housing which houses an electronic circuit board. The housing may house a choke coil (a noise filter) which reduces noise (for example, refer to JP-2013-069737-A).

In such electronic control unit, plural connection terminals may be provided on a bottom of a housing so as to project therefrom, and conductors pulled out of the choke coil may be attached to respective distal end portions of the connection terminals, thereby holding the choke coil in the housing.

If the choke coil is supported by the connection terminals, it may be difficult to hold the choke coil to the housing in a stable fashion when a vehicle vibrates excessively.

SUMMARY

Aspect 1 of the present invention provides an electronic control unit including: a housing including an accommodating portion, the accommodating portion including a support portion; and a noise filter including an engaging portion, at least part of the noise filter being housed in the accommodating portion of the housing in a state where the engaging portion is in engagement with the support portion.

The noise filter is a component which reduces noise in an electronic circuit, and a component such as a choke coil or a condenser, for example, can be used for the noise filter.

Since the noise filter is supported on the housing, even when the housing vibrates excessively, the noise filter can be held to the housing in a stable fashion.

Aspect 2 of the present invention may be provided, based on the above configuration, the electronic control unit, wherein the noise filter includes a core member, and the core member is accommodated in the accommodating portion, wherein a connection terminal is formed in the housing so as to project therefrom, and a conductor of the noise filter is attached to the connection terminal, wherein the engaging portion projects from an axial end face of the core member, and wherein the support portion includes a support groove, and the engaging portion is inserted into the support portion.

In this configuration, the engaging portion is brought into engagement with the support portion easily.

As the noise filter having the core member, a common mode choke coil or a normal mode choke coil may be used.

The core member may include a core material having magnetic properties and a case which accommodates the core material.

Aspect 3 of the present invention may be provided, based on the above configuration, wherein two of the engaging portions project from both of the axial end faces of the core member, and wherein the accommodating portion includes two of the support portions, and both the engaging portions are brought respectively into engagement with both the support portions.

In this configuration, the noise filter can be held to the housing in a more stable fashion.

Aspect 4 of the present invention may be provided, based on the above configuration, wherein an inner surface of the accommodating portion includes two of support surfaces which face respectively both the axial end faces of the core member, and two of the support portions are formed respectively on the support surfaces, and wherein, in the accommodating portion, a space between both the support surfaces reduces gradually from a side of an opening portion towards a side of a bottom portion.

In this configuration, when the core member is inserted into the accommodating portion, the conductor of the noise filter can be positioned with respect to the connection terminal as a result of both end portions of the core member being guided by both the support surfaces.

Aspect 5 of the present invention may be provided, based on the above configuration, wherein the engaging portion is press-fitted in the support groove.

In this configuration, the noise filter can be held to the housing in an ensured fashion.

Aspect 6 of the present invention may be provided, based on the above configuration, wherein the support groove includes: a first guide groove which is formed continuously from an opening portion of the support groove; a second guide groove which is formed continuously from the first guide groove; and a holding groove which is formed continuously from the second guide groove and in which the engaging portion is press-fitted, wherein a width of the first guide groove reduces gradually from a side of the opening portion to a side of the second guide groove, wherein a width of the second guide groove reduces gradually from a side of the first guide groove to a side of the holding groove, and wherein an inclined angle at which a side surface of the second guide groove is inclined relative to a side surface of the holding groove is smaller than an inclined angle at which a side surface of the first guide groove is inclined relative to the side surface of the holding groove.

In this configuration, in case the width of the support groove is made to reduce gradually as the support groove extends from the opening portion to the bottom surface thereof as described above, when the engaging portion is inserted into the support groove, the engaging portion is guided smoothly into the holding groove. Therefore, the assembling performance of bringing the engaging portion into engagement with the support portion can be enhanced.

Aspect 7 of the present invention may be provided, based on the above configuration, wherein the engaging portion includes plural abutment portions to be brought into abutment with an inner surface of the support groove, and the plural abutment portions are aligned in an extending direction of the support groove.

In this configuration, a pressing force generated by the contact of both the side surfaces of the engaging portion with the inner surface of the support groove is scattered to the plural abutment portions. Thus, the engaging portion can be inserted smoothly into the support groove.

The plural abutment portions which are aligned in the extending direction of the support groove are brought into contact with the inner surface of the support groove. Thus, the engaging portion can be prevented from being inclined within the support groove, thereby holding the engaging portion to the support portion in a stable fashion.

Aspect 8 of the present invention may be provided, based on the above configuration, wherein a gap is formed between the engaging portion and a bottom surface of the support groove.

In this configuration, when the conductor of the noise filter is connected to the connection terminal, the engaging portion is not in abutment with the bottom surface of the support groove. Namely, when the engaging portion is inserted into the support groove, the conductor of the noise filter can be positioned in a state where the conductor is in contact with the connection terminal.

In the electronic control unit of the invention, even when the housing vibrates excessively, the noise filter can be held to the housing in a stable fashion.

BRIEF DESCRIPTION OF DRAWINGS

FIG. 3A is a sectional view taken along a line A-A in FIG. 1. FIG. 3B is an enlarged view showing a support portion and an engaging portion.

FIG. 4A is a plan view. FIG. 4B is a sectional view taken along a line B-B in FIG. 4A. FIG. 4C is a sectional view taken along a line C-C in FIG. 4A.

FIG. 5A is a perspective view. FIG. 5B is a front view. FIG. 5C is a side view.

FIG. 6A is a side sectional view showing a configuration in which a fitting groove is formed on a support portion. FIG. 6B is a side sectional view showing a configuration in which an engaging portion has a circular cross section.

FIG. 7A is a plan view. FIG. 7B is a sectional view taken along a line D-D in FIG. 7A.

FIGS. 9A and 9B show the normal mode choke coil according to the second embodiment. FIG. 9A is an exploded perspective view. FIG. 9B is a perspective view.

DETAILED DESCRIPTION

Figure 1:
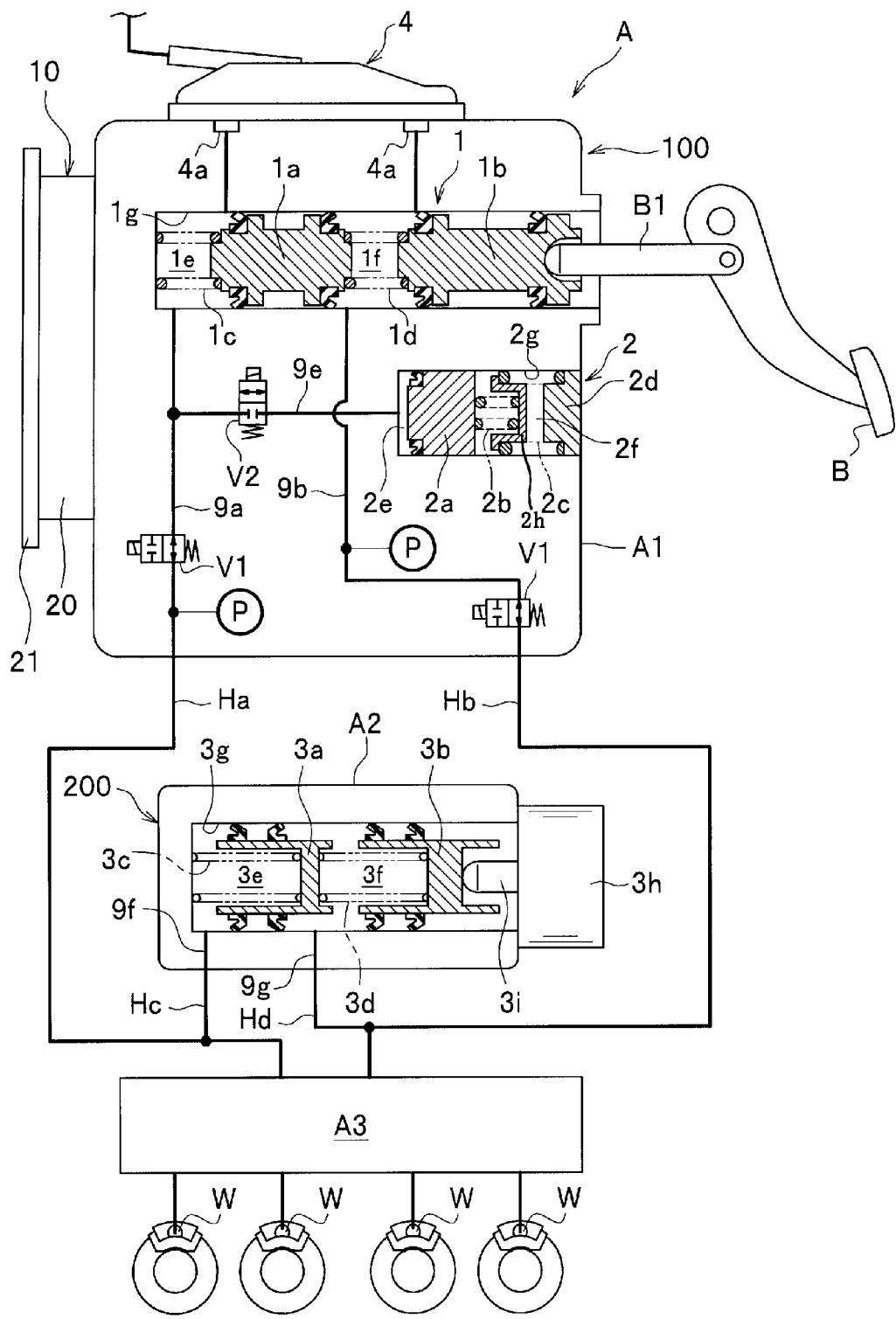
FIG. 1 is a schematic diagram showing a vehicle brake fluid pressure control system which utilizes an electronic control unit according to a first embodiment.

Embodiments will be described in detail by referring to the drawings as required.

In describing the embodiment, like reference numerals will be given to like configuring elements, so that repeated descriptions thereof are omitted.

First Embodiment

In a first embodiment, an example in which an electronic control unit is applied to a vehicle brake fluid pressure control system is described.

In the following description, up-to-down, front-to-rear and left-to-right directions are those set as a matter of convenience in describing the electronic control unit and hence are not intended to limit the configuration of the electronic control unit.

In the following description, an overall configuration of the vehicle brake fluid pressure control system will be described first, and thereafter, the electronic control unit will be described in detail.

As shown in FIG. 1, a vehicle brake fluid pressure control system A includes both a brake system utilizing the brake-by-wire approach which is activated to operate when a prime mover (an engine or an electric motor) is started and a hydraulic brake system which is activated to operate when the prime mover is stopped.

The vehicle brake fluid pressure control system A can be installed not only in a motor vehicle which utilizes only an engine (an internal combustion engine) for a power source but also in a hybrid electric vehicle which utilizes a motor as well for a power source, or an electric vehicle or a fuel cell vehicle which utilizes only a motor for a power source.

The vehicle brake fluid pressure control system A includes an input unit A1 which generates a brake fluid pressure according to a stroke amount (an operation amount) of a brake pedal B (a brake operator).

The vehicle brake fluid pressure control system A includes a slave cylinder A2 which drives a motor $3h$ (an electric actuator) according to a stroke amount of the brake pedal B to thereby generate a brake fluid pressure.

The vehicle brake fluid pressure control system A includes a fluid pressure control unit A3 which assists in stabilizing the behavior of the vehicle.

The input unit A1, the slave cylinder A2 and the fluid pressure control unit A3 are configured as separate units and communicate with one another via external piping.

The input unit A1 includes a base body 100, a master cylinder 1 which generates a fluid pressure according to a stroke amount of the brake pedal B, a stroke simulator 2 which imparts a pseudo operation reaction force to the brake pedal B, and an electronic control unit 10.

The base body 100 is a metallic block which is installed in the vehicle. Two cylinder bores $1g$, $2g$ and plural hydraulic lines $9a$ to $9e$ are formed in the base body 100. Various components including a reservoir 4 are attached to the base body 100.

The master cylinder 1 is a dual or tandem master cylinder using two pistons in a single cylinder bore and is made up of two pistons $1a$, $1b$ and two coil springs $1c$, $1d$. The master cylinder 1 is provided in the cylinder bore $1g$, which is a first cylinder bore, having a bottomed cylindrical shape.

A first pressure chamber $1e$ is formed between a bottom surface of the first cylinder bore $1g$ and the piston $1a$, which is a first piston. The coil spring $1c$, which is a first coil spring, is accommodated in the first pressure chamber $1e$. The first coil spring $1c$ pushes back the first piston $1a$ which is moved towards the bottom surface towards an opening portion of the first cylinder bore $1g$.

A second pressure chamber $1f$ is formed between the first piston $1a$ and the second piston $1b$. In the second pressure chamber $1f$, the second coil spring $1d$ is accommodated. The second coil spring $1d$ pushes back the second piston $1b$ which is moved towards the bottom surface towards the opening portion of the first cylinder bore $1g$.

A rod B1 of the brake pedal B is inserted into the first cylinder bore $1g$. A distal end portion of the rod B1 is connected to the second piston $1b$. This allows the second piston $1b$ to be connected to the brake pedal B via the rod B1.

With pedal effort on the brake pedal B applied thereto, the first piston 1a and the second piston 1b slide within the first cylinder bore 1g towards the bottom surface, pressurizing a brake fluid in the corresponding pressure chambers 1e, 1f.

The reservoir 4 is a container which reserves a brake fluid therein and is attached to an upper surface of the base body 100. The brake fluid reserved in the reservoir 4 is supplied therefrom to the pressure chambers 1e, 1f by way of corresponding communication holes 4a, 4a.

The stroke simulator 2 is made up of a piston 2a, two coil springs 2b, 2c, a spring connector 2h and a lid member 2d. The stroke simulator 2 is provided in the cylinder bore 2g having a bottomed cylindrical shape, which is a second cylinder bore. An opening portion of the second cylinder bore 2g is closed by the lid member 2d.

A pressure chamber 2e is formed between a bottom surface of the second cylinder bore 2g and the piston 2a. An accommodating chamber 2f is formed between the piston 2a and the lid member 2d. The two coil springs 2b, 2c are accommodated in the accommodating chamber 2f. Both the coil springs 2b, 2c are connected via the spring connector 2h. Both the coil springs 2b, 2c push back the piston 2a which is moved towards the lid member 2d towards the bottom surface of the second cylinder bore 2g and impart an operation reaction force to the brake pedal B.

Next, the individual hydraulic lines which are formed in the base body 100 of the input unit A1 will be described.

A first main hydraulic line 9a is a hydraulic line which originates from the first pressure chamber 1e of the first cylinder bore 1g. A piping Ha reaching the fluid pressure control unit A3 is connected to an output port where the first main hydraulic line 9a terminates.

A second main hydraulic line 9b is a hydraulic line which originates from the second pressure chamber 1f of the first cylinder bore 1g. A piping Hb reaching the fluid pressure control unit A3 is connected to an output port where the second main hydraulic line 9b terminates.

A branch hydraulic line 9e is a hydraulic line which branches off the first main hydraulic line 9a to reach the pressure chamber 2e of the stroke simulator 2.

In the first main hydraulic line 9a, a normally open solenoid valve V1 configured to open and close the first main hydraulic line 9a is provided downstream of (closer to the output port than) a connecting portion with the branch hydraulic line 9e. This solenoid valve V1 is a master cut-off valve which cuts off a communication between an upstream side and a downstream side of the first main hydraulic line 9a when the solenoid valve V1 is switched from an open state to a closed state.

A normally open solenoid valve V1 configured to open and close the second main hydraulic line 9b is provided on the second main hydraulic line 9b. This solenoid valve V1 is a master cut-off valve which cuts off a communication between an upstream side and a downstream side of the second main hydraulic line 9b when the solenoid valve V1 is switched from an open state to a closed state.

A normally closed solenoid valve V2 is provided on the branch hydraulic line 9e. This solenoid valve V2 opens and closes the branch hydraulic line 9e.

Two pressure sensors P, P detect the magnitude of a brake fluid pressure. Pieces of information acquired by the two pressure sensors P, P are outputted to the electronic control unit 10.

The pressure sensor P for the first main hydraulic line 9a is disposed downstream of (closer to the output port than) the solenoid valve V1 and detects a brake fluid pressure generated in the slave cylinder A2.

The pressure sensor P for the second main hydraulic line 9b is disposed upstream of (closer to the master cylinder 1 than) the solenoid valve V1 and detects a brake fluid pressure generated in the master cylinder 1.

The electronic control unit 10 controls not only the opening and closing of the solenoid valves V1, V2 but also the operation of a motor 3h for the slave cylinder A2 based on pieces of information obtained from various sensors such as the pressure sensors P and a stroke sensor and a program which is stored in advance.

The slave cylinder A2 includes a base body 200 which has a cylinder bore 3g having the shape of a bottomed cylinder, slave pistons 3a, 3b which slide within the cylinder bore 3g and the motor 3h.

The base body 200 is a metallic component which is installed in the vehicle, and various components including a reservoir are attached to the base body 200.

A first pressure chamber 3e is formed between a bottom surface of the cylinder bore 3g and the slave piston 3a, which is a first slave piston. A first coil spring 3c is accommodated in the first pressure chamber 3e. The first coil spring 3c pushes back the first slave piston 3a which is moved towards the bottom surface towards an opening portion of the cylinder bore 3g.

A second pressure chamber 3f is formed between the first slave piston 3a and the slave piston 3b, which is a second slave piston. A second coil spring 3d is accommodated in the second pressure chamber 3f. The second coil spring 3d pushes back the second slave piston 3b which is moved towards the bottom surface towards the opening portion of the cylinder bore 3g.

The motor 3h (an electric actuator) is an electric servomotor which is controlled to be driven by the electronic control unit 10 of the input unit A1.

The motor 3h is attached to a side surface of the base body 200, and a rod 3i projecting from the motor 3h is inserted into the cylinder bore 3g.

A distal end portion of the rod 3i is in abutment with the second slave piston 3b. Then, when the rod 3i moves towards the bottom surface of the cylinder bore 3g, an input from the rod 3i is given to both the slave pistons 3a, 3b. Thus, the slave cylinders 3a, 3b move within the cylinder bore 3g, pressurizing the brake fluid in both the pressure chambers 3e, 3f.

Next, hydraulic lines formed in the base body 200 of the slave cylinder A2 will be described.

A first communication hydraulic line 9f is a hydraulic line which originates from the first pressure chamber 3e of the cylinder bore 3g. A piping Hc which branches off the piping Ha is connected to an output port where the first communication hydraulic line 9f terminates.

A second communication hydraulic line 9g is a hydraulic line which originates from the second pressure chamber 3f of the cylinder bore 3g. A piping Hd which branches off the piping Hb is connected to an output port where the second communication hydraulic line 9g terminates.

The fluid pressure control unit A3 controls a brake fluid pressure applied to a wheel cylinder W of each of wheel brakes and is configured to execute an anti-lock braking control, a skid control for stabilizing the behavior of a vehicle and a traction control.

Although the illustration thereof is omitted, the fluid pressure control unit A3 includes a hydraulic unit in which a solenoid valve and a pump are provided, a motor which drives the pump and an electronic control unit for controlling the solenoid valve and the motor.

The fluid pressure control unit A3 is connected to the input unit A1 by way of the pipings Ha, Hb and is also connected to the slave cylinder A2 by way of the pipings Ha, Hc and the pipings Hb, Hd. The fluid pressure control unit A3 is connected to the wheel cylinders W by way of piping.

Next, the operation of the vehicle brake fluid pressure control system A will briefly be described.

In the vehicle brake fluid pressure control system A, when the stroke sensor detects that the brake pedal B has been operated, the electronic control unit 10 switches both the normally open solenoid valves V1, V1 to the closed states to thereby cut off communications between the upstream sides and the downstream sides of both the main hydraulic lines 9a, 9b.

The electronic control unit 10 opens the normally closed solenoid valve V2, thereby allowing the brake fluid to flow from the first main hydraulic line 9a to the stroke simulator 2 through the branch hydraulic line 9e.

Having received the pedal effort exerted on the brake pedal B, both the pistons 1a, 1b of the master cylinder 1 slide in the first master cylinder bore 1g towards the bottom surface thereof, pressurizing the brake fluid in both the pressure chambers 1e, 1f. As this occurs, since the communications between the upstream sides and the downstream sides of both the main hydraulic lines 9a, 9b are cut off, brake fluid pressures generated in the pressure chambers 1e, 1f are not transmitted to the wheel cylinders W.

When the brake fluid in the first pressure chamber 1e is pressurized, the brake fluid flows from the first main hydraulic line 9a to the branch hydraulic line 9e. Then, the brake fluid in the pressure chamber 2e of the stroke simulator 2 is pressurized. Thus, the piston 2a moves towards the lid member 2d against biasing forces of the coil springs 2b, 2c.

This moves the brake pedal B, and a biasing force directed towards the bottom surface of the cylinder bore 2g is generated in the piston 2a by the coil springs 2b, 2c. Thus, a pseudo operation reaction force is applied from the piston 2a to the brake pedal B.

When a depression of the brake pedal B is detected by the stroke sensor, the motor 3h of the slave cylinder A2 is driven.

The electronic control unit 10 compares a brake fluid pressure outputted from the slave cylinder A2 with a brake fluid pressure outputted from the master cylinder 1 and controls the revolution speed of the motor 3h based on the results of the comparison.

In the slave cylinder A2, having received an input from the rod 3i, the slave pistons 3a, 3b slide within the cylinder bore 3g towards the bottom surface thereof, pressurizing the brake fluid in both the pressure chambers 3e, 3f.

In this way, in the slave cylinder A2, the brake fluid pressure is generated according to the stroke amount of the brake pedal B.

The brake fluid pressure generated in the slave cylinder A2 is inputted from the pipings Hc, Hd into the fluid pressure control unit A3 through the pipings Ha, Hb.

The brake fluid pressure is transmitted from the fluid pressure control unit A3 to the wheel cylinders W, thereby activating the wheel cylinders W to operate, and applying a braking force to corresponding wheels.

In a state where the slave cylinder A2 is kept inoperable (for example, in a state where no electric power is obtained), both the solenoid valves V1, V1 are kept open, and hence, the communications are established between the upstream sides and the downstream sides of both the main hydraulic lines 9a, 9b. In addition, the solenoid valve V2 is kept closed.

In this state, the brake fluid pressures in both the main hydraulic lines 9a, 9b are raised by the master cylinder 1. Then, the brake fluid pressures at the wheel cylinders W which communicate with the main hydraulic lines 9a, 9b are raised, thereby applying the braking force to the corresponding wheels.

Next, the electronic control unit 10 of the first embodiment will be described.

Figure 2:
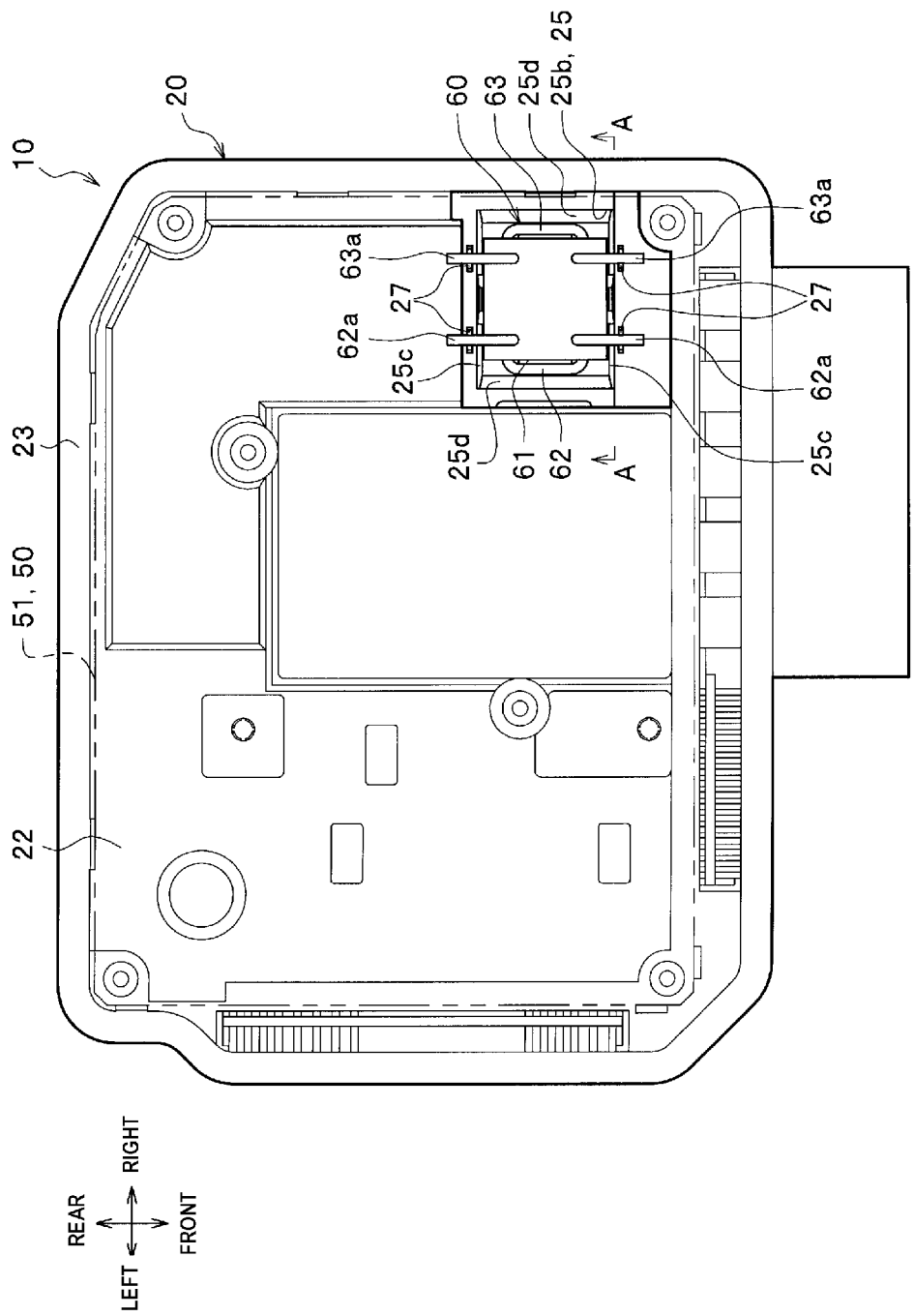
FIG. 2 is a plan view showing the electronic control unit according to the first embodiment.

As shown in FIG. 2, the electronic control unit 10 includes a housing 20 which is a box member of a synthetic resin, an electronic circuit board 50 which is housed in the housing 20 and a common mode choke coil 60 (a noise filter).

As shown in FIG. 1, the housing 20 is attached to one surface of the base body 100 so as to cover the electric components such as the solenoid valves V1, V2 and the pressure sensors P which project from the one surface of the base body 100.

The housing 20 is opened in a surface on a side (a front side) which is an opposite side to a side (a rear side) which faces the basic body 100 and the surface which faces the basic body 100. An opening portion on the front side of the housing 20 is closed by a cover 21 of a synthetic resin.

FIG. 2 shows a state where the cover 21 is removed from the housing. As shown in FIG. 2, the housing 20 includes a plate-shaped partition portion 22 and a circumferential wall portion 23 which is formed along a circumferential edge portion of the partition portion 22.

The electronic circuit board 50 is such that electronic components such as semiconductor chips are attached to a rectangular circuit board main body 51 on which electronic circuitries are printed.

The electronic circuit board 50 is configured to control the operations of the solenoid valves and the motors based on pieces of information acquired from the various sensors including the pressure sensors and a program which is stored in advance.

Figure 3A:
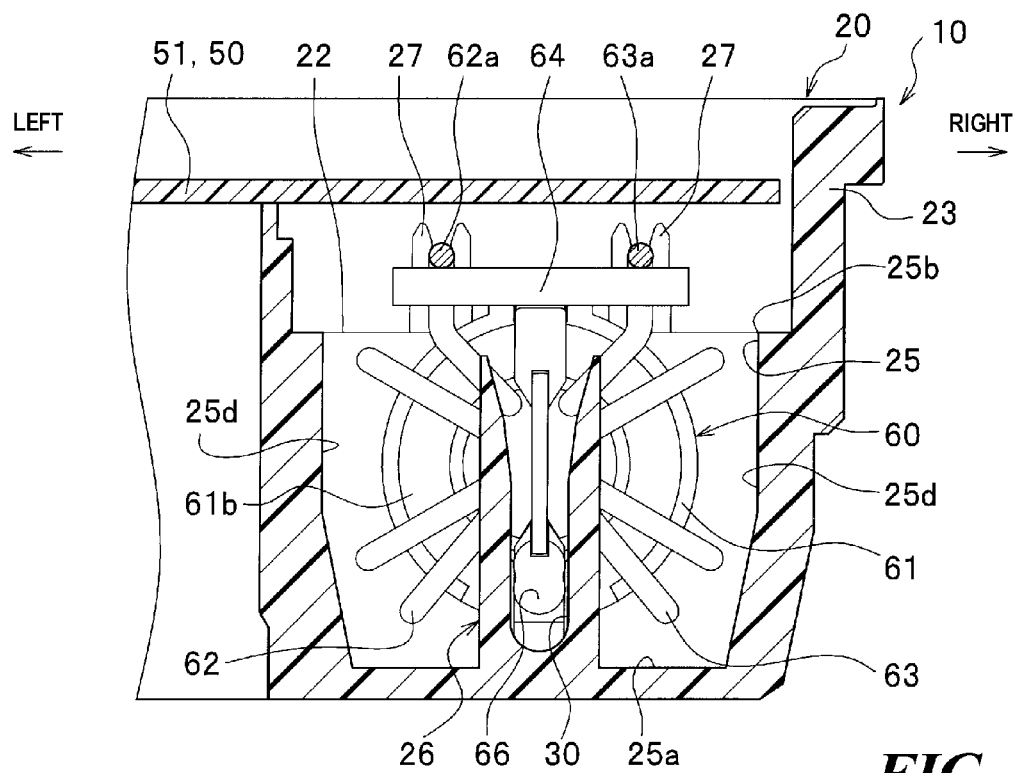
FIGS. 3A and 3B show an accommodating portion and a common mode choke coil according to the first embodiment.
Figure 3B:
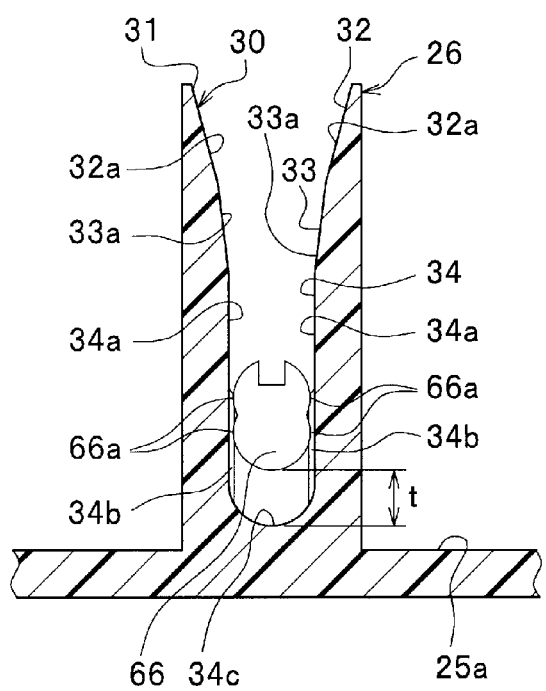

The circuit board main body 51 is attached to plural support portions which are provided on a front surface of the partition portion 22 so as to project therefrom, and the circuit board main body 51 is disposed so as to be spaced apart from the front surface of the partition portion 22 (refer to FIGS. 3A and 3B).

The common mode choke coil 60 is attached to a front surface side of the partition portion 22. In an electronic circuitry of the electronic circuit board 50, the common mode choke coil 60 functions as a noise filter which reduces common mode noise which is generated between a signal line and a power supply line and a ground (GND).

Figure 5A:
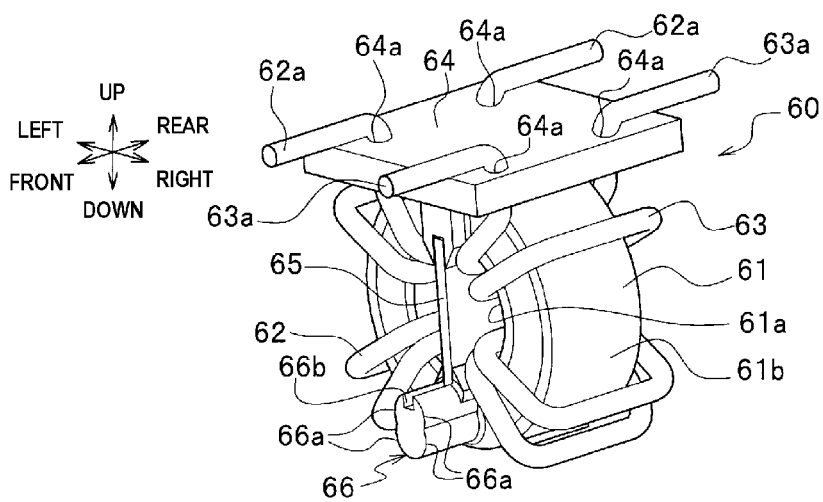
FIGS. 5A to 5C show the common mode choke coil according to the first embodiment.

As shown in FIG. 5A, the common mode choke coil 60 includes a core member 61, two left and right conductors 62, 63 which are wound around the core member 61, and a base plate 64.

The core member 61 is a cylindrical member having a central bore 61a which penetrates the core member 61 in a front-to-rear direction. The direction of a central axis of the core member 61 is disposed in the front-to-rear direction.

The core member 61 includes a hollow case 61b of a synthetic resin and an iron core material (not shown) having magnetic properties. The core material is housed in the case 61b.

The conductor 62, which is a first conductor, is wound around a left half of the core member 61. End portions 62a, 62a of the first conductor 62 are pulled out from a left upper portion of the core member 61 to the front and rear so as to extend upwards.

As with the left half of the core member 61, the conductor 63, which is a second conductor, is wound around a right half of the core member 61. End portions 63a, 63a of the second conductor 63 are pulled out from a right upper portion of the core member 61 to the front and rear so as to extend upwards.

Figure 5B:
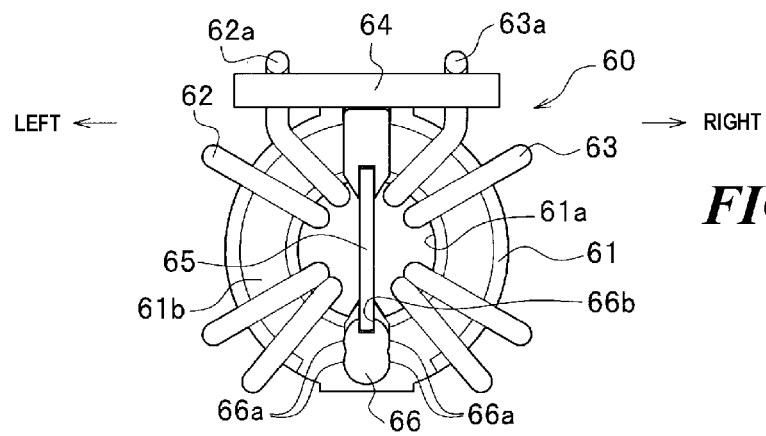

As shown in FIG. 5B, a partition wall 65 is inserted into the central bore 61a of the core member 61. A space in the central bore 61a is partitioned into left and right portions by the partition wall 65 so as to prevent the contact between the first conductor 62 and the second conductor 63.

Engaging portions 66, 66 are provided respectively at lower end portions of axial end faces (in the front-to-rear direction) of the core member 61 so as to project therefrom. As shown in FIG. 3A, the engaging portion 66 is a portion which is brought into engagement with a support portion 26 within an accommodating portion of the housing 20.

Figure 5C:
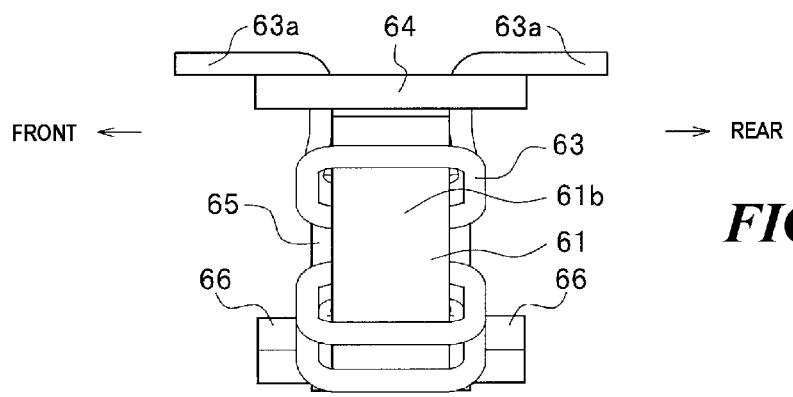

As shown in FIG. 5C, the engaging portion 66 which is formed on the front end face of the core member 61 has the same shape as the shape of the engaging portion 66 formed on the rear end face of the core member 61.

As shown in FIG. 5B, a cross section of the engaging portion 66 taken along a direction which is at right angles to the direction of an axis thereof has a shape resulting from partially overlapping two upper and lower circles. In other words, the engaging portion 66 is constricted laterally at a substantially central portion in relation to a height direction thereof. Abutment portions 66a, which each project into an arc-like shape, are provided on each side surface of the engaging portion 66 so as to be aligned in an up-to-down direction.

As shown in FIG. 5A, a rectangular groove portion 66b extends along the axial direction of the engaging portion 66 on an upper end portion thereof. The groove portion 66b is a portion through which a lower end edge of the partition wall 65 passes when the partition wall 65 is inserted into the central bore 61a.

The base plate 64 is a rectangular plate of a synthetic resin, and passage holes 64a are formed respectively in four or front, rear, left and right corners.

As shown in FIG. 5B, the upper end portion of the core member 61 is joined to a center of a lower surface of the base plate 64 by an adhesive.

As shown in FIG. 5A, the end portions 62a, 63a of the conductors 62, 63 are passed through the passage holes 64a in the base plate 64 from a lower side to an upper side of the base plate 64.

The end portions 62a, 63a of the conductors 62, 63 which lie at a front side of the base plate 64 are bent at right angles on the upper side of the base plate 64 so as to extend to the front. On the other hand, the end portions 62a, 63a of the conductors 62, 63 which lie at a rear side of the base plate 64 are bent at right angles on the upper side of the base plate 64 so as to extend to the rear.

Next, an attaching construction of attaching the common mode choke coil 60 to the housing 20 according to the first embodiment will be described.

As shown in FIG. 2, the accommodating portion 25 is formed on an upper surface of the partition portion 22 of the housing 20, and the core member 61 of the common mode choke coil 60 is accommodated in the accommodating portion 25.

Figure 4A:
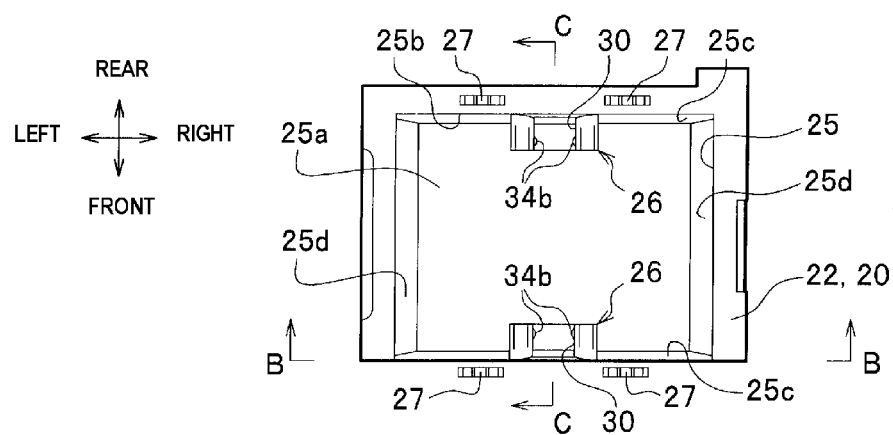
FIGS. 4A to 4C show the accommodating portion according to the first embodiment.

The accommodating portion 25 is a bottomed recess portion which is formed in a right front area of the upper surface of the partition portion 22. As shown in FIG. 4A, a bottom surface 25a and an opening portion 25b of the accommodating portion 25 are each formed into a quadrangular shape as seen from thereabove.

As shown in FIG. 2, in four side surfaces of the accommodating portion 25, two front and rear side surfaces are support surfaces 25c, 25c which face end portions of the core member 61.

Figure 4B:
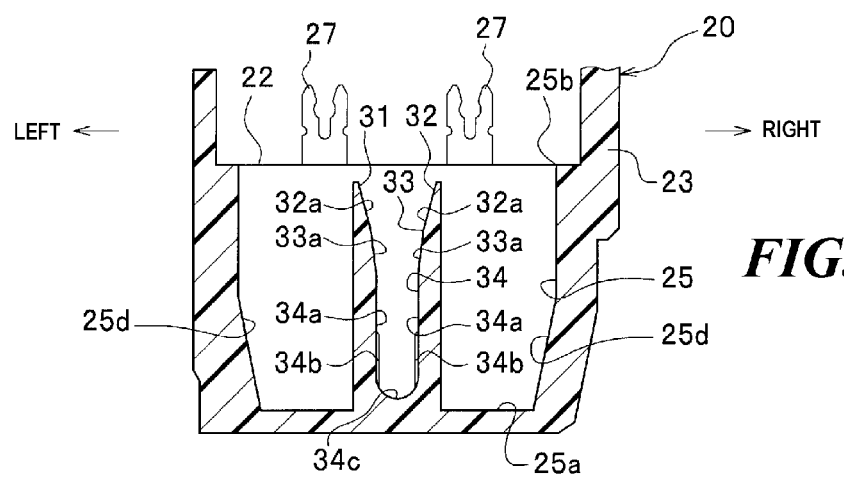
Figure 4C:
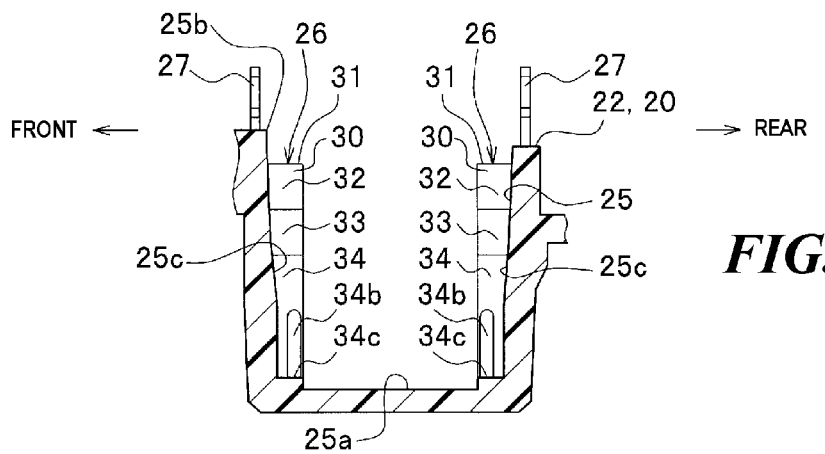

As shown in FIG. 4C, in the accommodating portion 25, a space defined between the support surfaces 25c, 25c reduces gradually from the opening portion 25b towards a substantially central portion of the accommodating portion 25 in relation to a height direction thereof. Namely, the support surfaces 25c, 25c are inclined into a tapered shape so that a width of the accommodating portion 25 in the front-to-rear direction reduces gradually as they extend from the opening portion 25b towards the substantially central portion in relation to the height direction.

The accommodating portion 25 is formed so that the space defined between the support surfaces 25c, 25c remains constant from the substantially central portion in the height direction to the bottom surface 25a of the accommodating portion 25.

Although the support portion 26 has been described before in relation to the engaging portion 66, to describe specifically, as shown in FIG. 4A, a pair of support portions 26, 26 are provided respectively at central portions on the support surfaces 25c, 25c in relation to a left-to-right direction thereof so as to project therefrom. As described before, the support portion 26 is the portion with which the corresponding engaging portion 66 of the core member 61 is brought into engagement, as shown in FIG. 3A.

As shown in FIG. 4B, the support portion 26 rises vertically from the bottom surface 25a towards the opening portion 25b of the accommodating portion 25. An upper end portion of the support portion 26 is disposed below the opening portion 25b of the accommodating portion 25.

A support groove 30 is formed in the support portion 26 so that the engaging portion 66 of the core member 61 is inserted thereinto as shown in FIG. 3A.

As shown in FIGS. 4A and 4B, the support groove 30 is a recessed groove of a rectangular cross section which is opened to an inner surface and an upper end face of the support portion 26.

As shown in FIG. 4B, the support groove 30 is formed into a straight line from a lower end portion all the way up to the upper end portion of the support portion 26 so as to extend vertical relative to the bottom surface 25a of the accommodating portion 25.

A first guide groove 32, a second guide groove 33 and a holding groove 34 are formed in the support groove 30. The first guide groove 32 is formed continuously from an opening portion 31 at an upper end portion of the support groove 30. The second guide groove 33 is formed continuously from the first guide groove 32. The holding groove 34 is formed continuously from the second guide groove 33. Namely, the support groove 30 is formed as a result of the first guide groove 32, the second guide groove 33 and the holding groove 34 connecting continuously to one another in the up-to-down direction.

The support groove 30 is formed so that a width at the opening portion 31 becomes the greatest while a width at the holding groove 34 becomes the smallest. Thus, the support groove 30 is formed so that the width thereof reduces gradually from the opening portion 31 towards the holding groove 34.

Two left and right side surfaces 32a, 32a of the first guide groove 32 are formed so that a left-to-right width of the first guide groove 32 reduces gradually as the first guide groove 32 extends from the opening portion 31 towards the second guide groove 33. Namely, the side surfaces 32a, 32a of the first guide groove 32 are inclined into a tapered shape. A left-to-right width of the first guide groove 32 at a lower end portion thereof is the same as a left-to-right width of the second guide groove 33 at an upper end portion thereof.

Two left and right side surfaces 33a, 33a of the second guide groove 33 are formed so that a left-to-right width of the second guide groove 33 reduces gradually as the second guide groove 33 extends from the first guide groove 32 towards the holding groove 34. Namely, the side surfaces 33a, 33a of the second guide groove 33 are inclined into a tapered shape. A left-to-right width of the second guide groove 33 at a lower end portion thereof is the same as a left-to-right width of the holding groove 34 at an upper end portion thereof.

The width of the holding groove 34 is the same as the width of the second guide groove 33 at the lower end portion thereof and remains constant along a full length thereof. Namely, left and right side surfaces 34a, 34a of the holding groove 34 extend vertically with respect to the bottom surface 25a of the accommodating portion 25. A bottom surface 34c of the holding groove 34 is formed into the shape of a semicircular lower half portion of a circle.

Holding portions 34b, 34b are provided respectively on the side surfaces 34a, 34a of the holding groove 34 so as to project therefrom (refer to FIG. 4C). The holding portions 34b are each formed so as to extend in a straight line from the bottom surface 34c to a substantially central portion of the holding groove 34 in relation to a height direction thereof.

As shown in FIG. 3B, a smallest space defined between the holding portions 34b, 34b is slightly smaller than a greatest width of the engaging portion 66. Consequently, when the engaging portion 66 is inserted into the holding groove 34, the abutment portions 66a of the engaging portion 66 are forcibly pushed in between the holding portions 34b, 34b. The engaging portion 66 is press-fitted in the engaging groove 34, thereby being held in the holding groove 34.

In the support groove 30, an inclined angle at which the side surface 33a of the second guide groove 33 is inclined relative to the side surface 34a of the holding groove 34 is smaller than an inclined angle at which the side surface 32a of the first guide groove 32 is inclined relative to the side surface 34a of the holding groove 34.

The accommodating portion 25 is formed so that a space defined between two left and right side surfaces 25d, 25d remains constant from the opening portion 25b to a substantially central portion in relation to a height direction thereof, as shown in FIG. 4B.

In the accommodating portion 25, the space defined between the side surfaces 25d, 25d or the left-to-right space reduces gradually from the central portion in the height direction towards the bottom surface 25a. Namely, the side surfaces 25d, 25d of the accommodating portion 25 are inclined into a tapered shape from the central portion in the height direction towards the bottom surface 25a so that the left-to-right width of the accommodating portion 25 reduces gradually.

As shown in FIG. 2, four connection terminals 27 are provided on the upper surface of the partition portion 22 of the housing 20 so as to project therefrom.

Two left and right connection terminals 27 are provided at each of front and rear sides of the opening portion 25b of the accommodating portion 25.

The connection terminals 27 are formed at distal end portions of bus bars (not shown) which are embedded in the partition portion 22. Proximal end portions of the bus bars are connected electrically to an electronic circuitry on the electronic circuit board 50.

The end portions 62a, 63a of the conductors 62, 63 of the common mode choke coil 60 are inserted respectively into groove portions at distal end portions of the connection terminals 27 as shown in FIG. 3A. Then, when electrodes of a welding apparatus are energized with the connection terminal 27 held by the electrodes of the welding apparatus from left and right sides thereof, the end portions 62a, 63a of the conductors 62, 63 are resistance welded to the corresponding connection terminals 27.

In this way, the common mode choke coil 60 and the electronic circuitry of the electronic circuit board 50 are electrically connected together via the bus bars (not shown).

The core member 61 is inserted into the accommodating portion 25 in a state where the conductors 62, 63 of the common mode choke coil 60 are attached to the corresponding connection terminals 27. The engaging portions 66 of the core member 61 are inserted into the support grooves 30 of the support portions 26 and are then press-fitted into the holding grooves 34. As a result, the engaging portions 66 are supported elastically in the support grooves 30.

The engaging portion 66 is positioned relative to the core member 61 so that a gap t is defined between the engaging portions 66 and the bottom surface 34c of the support groove 30 with the conductors 62, 63 of the common mode choke coil 60 attached to the connection terminals 27.

In the electronic control unit 10 configured as described above, as shown in FIG. 3A, the engaging portions 66 of the core member 61 of the common mode choke coil 60 are in engagement with the support portions 26 in the accommodating portion of the housing 20. Thus, the core member 61 is supported in the housing 20.

Consequently, in the vehicle brake fluid pressure control system A using the electronic control unit 10 (refer to FIG. 1), even when the housing 20 vibrates excessively due to the vibration of the vehicle, the common mode choke coil 60 can be held to the housing 20 in a stable fashion.

As shown in FIG. 4C, the space defined between the two front and rear support surfaces 25c, 25c of the accommodating portion 25 reduces gradually from the opening portion 25b towards the bottom surface 25a.

Consequently, when the core member 61 (refer to FIG. 3A) is inserted into the accommodating portion 25, both end portions of the core member 61 are guided by the support surfaces 25c, 25c. This allows the conductors 62, 63 of the common mode choke coil 60 to be positioned properly relative to the corresponding connection terminals 27.

As shown in FIG. 3A, when the conductors 62, 63 of the common mode choke coil 60 are attached to the corresponding connection terminals 27, the engaging portions 66 are configured so as not to be brought into abutment with the bottom surfaces 34c of the support grooves 30. Consequently, the conductors 62, 63 of the common mode choke coil 60 can be attached to the corresponding connection terminals 27 in an ensured fashion.

As shown in FIG. 4B, the width of the support groove 30 is formed so as to reduce gradually from the opening portion 31 towards the bottom surface 34c. This allows the engaging portion 66 to be guided smoothly into the holding groove 34 when the engaging portion 66 is inserted into the support groove 30 as shown in FIG. 3A. Thus, the assembling performance in bringing the engaging portions 66 into engagement with the support portions 26 can be enhanced.

As shown in FIG. 3B, the abutment portions 66a are provided on each side surface of the engaging portion 66 so as to be aligned in the up-to-down direction, so that the abutment portions 66a so provided are forcibly pushed against the holding portions 34b, 34b of the holding groove 34. In this configuration, the pressing force generated from the contact of both the side surfaces of the engaging portion 66 with the inner surfaces of the holding groove 34 is scattered to each of the abutment portions 66a, and this allows the engaging portion 66 to be press-fitted smoothly in the holding groove 34.

The two abutment portions 66a, 66a which are provided on each side surface of the engaging portion 66 so as to be aligned in the extending direction (the up-to-down direction) of the holding groove 34 are brought into contact with the inner surfaces of the support groove 30, and this can prevent the inclination of the engaging portion 66 within the support groove 30, thereby holding the engaging portion 66 to the support portion 26 in a stable fashion.

While the first embodiment has been described heretofore, the invention is not limited to the first embodiment but can be modified as required without departing from the spirit and scope of the invention.

In the first embodiment, as shown in FIG. 4A, the two front and rear support portions 26, 26 are formed in the accommodating portion 25. However, the number of and where to dispose the support portions 26 are not limited to those described above, and hence, one or three or more support portions 26 may be formed within the accommodating portion 25.

As shown in FIG. 3B, the support portions 26 according to the first embodiment has the support groove 30 into which the engaging portion 66 is inserted. However, as long as the configuration is adopted in which the engaging portion 66 is brought into engagement with the support portion 26, there is imposed no limitation on the configurations of the engaging portion 66 and the support portion 26. For example, a configuration can also be adopted in which the engaging portion is inserted into a hole portion of the support portion.

Figure 6A:
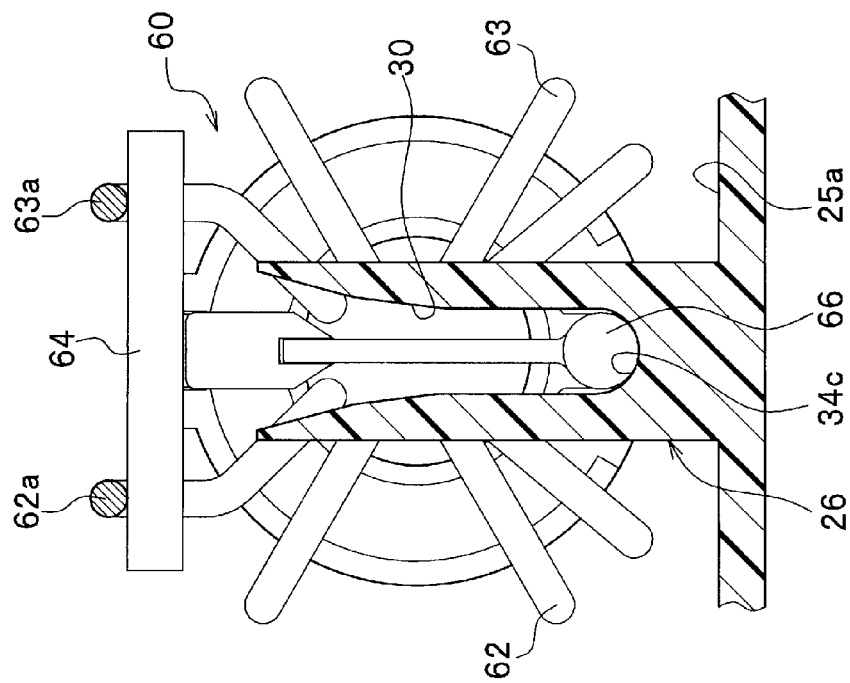
FIGS. 6A and 6B show a modified example of the first embodiment.

There is imposed no limitation on the shape of the support groove 30. Hence, the support groove 30 may be formed so as to have a constant width along the full length thereof. As shown in FIG. 6A, there may be formed a support groove 30 in which an opening portion 31 is formed smaller than a portion where the engaging portion 66 is held, so that the engaging portion 66 is fitted in the support groove 30.

Figure 6B:
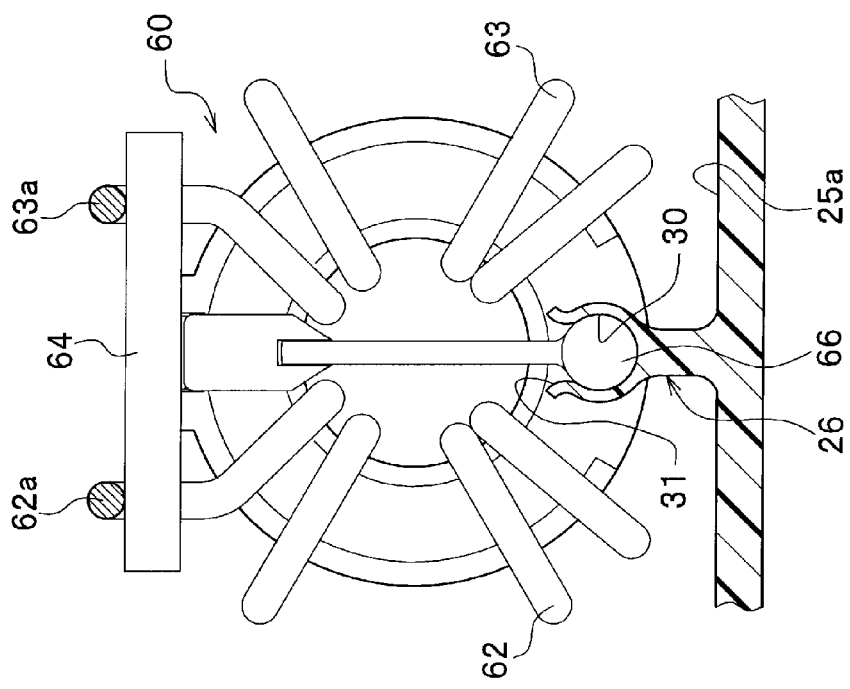

The shape of the engaging portion 66 is not limited to the shape described above, and hence, as shown in FIG. 6B, there may be formed an engaging portion 66 having a circular cross section taken along a direction which is at right angles to an axis thereof.

As shown in FIG. 3B, the holding portions 34b are formed on the side surfaces 34a of the holding groove 34. However, the side surfaces of the engaging portion 66 may be pushed directly against the inner surfaces of the holding groove 34 without providing the holding portions 34b on the inner surfaces of the holding groove 34.

In the first embodiment, the gap t is defined between the engaging portion 66 and the bottom surface 34c of the support groove 30. However, a configuration may be adopted in which the engaging portion 66 is in abutment with the bottom surface 34c of the support groove 30 (refer to FIG. 6B).

In the common mode choke coil 60 according to the first embodiment, as shown in FIG. 5A, the core member 61 having a ring-like shape is used. However, there is imposed no specific limitation on the shape of the core member.

In the first embodiment, as shown in FIG. 2, the common mode choke coil 60 is described as being used as the noise filter. However, there is imposed no specific limitation on the configuration of the noise filter, and hence, for example, various types of components including a condenser can be used.

The first embodiment, the electronic control unit 10 is applied to the vehicle brake fluid pressure control system. However, there is imposed no specific limitation on apparatuses or systems to which the electronic control unit of the invention is applied.

Second Embodiment

Next, an electronic control unit according to a second embodiment will be described.

An electronic control unit of the second embodiment has a configuration which is substantially the same as that of the electronic control unit 10 (refer to FIG. 2) of the first embodiment but differs therefrom in that a normal mode choke coil is used as a noise filter.

A normal mode choke coil 70 is a noise filter which reduces normal mode noise generated between signal lines or power supply lines in an electronic circuitry of an electronic circuit board as shown in FIG. 9A.

The normal mode choke coil 70 includes a core member 71 and a conductor 72. The core member 71 includes an iron core material 73 having magnetic properties and case 74 which houses the core material 73. The core material 73 is a cylindrical member, and the conductor 72 is wound around the core material 73. End portions 72a, 72a of the conductor 72 extend from end faces of the core material 73 in the direction of an axis of the core material 73 (refer to FIG. 7B).

The case 74 is a box member of a synthetic resin which houses the core material 73. The case 74 is a combination of an upper case 74a and a lower case 74b.

In the normal mode choke coil 70, as shown in FIG. 9B, the end portions 72a, 72a of the conductor 72 project respectively from axial end faces of the case 74.

Figure 7B:
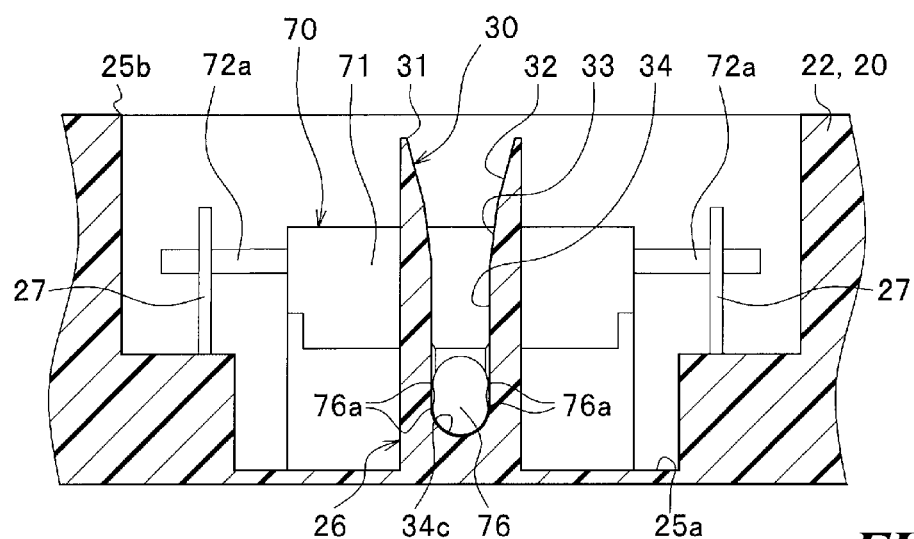
Figure 8:
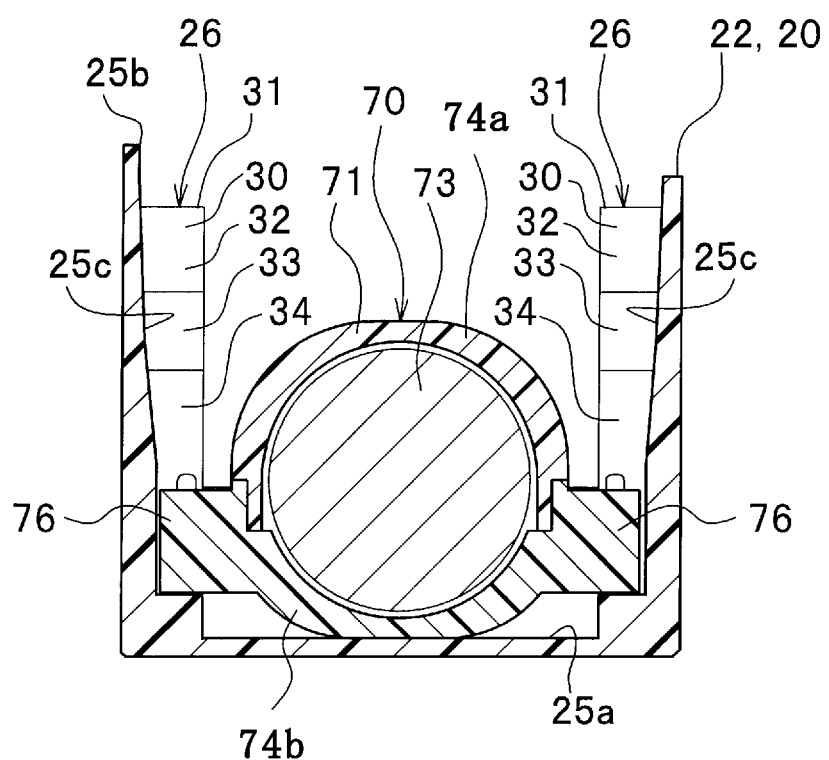
FIG. 8 is a sectional view taken along a line E-E in FIG. 7A, showing the accommodating portion and the normal mode choke coil according to the second embodiment.

As shown in FIG. 8, engaging portions 76, 76 are provided respectively at lower end portions on side surfaces of the case 74 so as to project therefrom. As shown in FIG. 7B, the engaging portions 76 are portions which are brought into engagement with support portions 26 of a housing 20.

Similar to the cross section of the engaging portion 66 (refer to FIG. 5B) of the common mode choke coil 60 of the first embodiment, a cross section of the engaging portion 76 of the normal mode coke coil 70 which is taken along a direction which is at right angles to an axis thereof has a shape resulting from overlapping of two upper and lower circles partially, and the engaging portion 76 is constricted in width at a substantially central portion in relation to a height direction thereof.

Figure 7A:
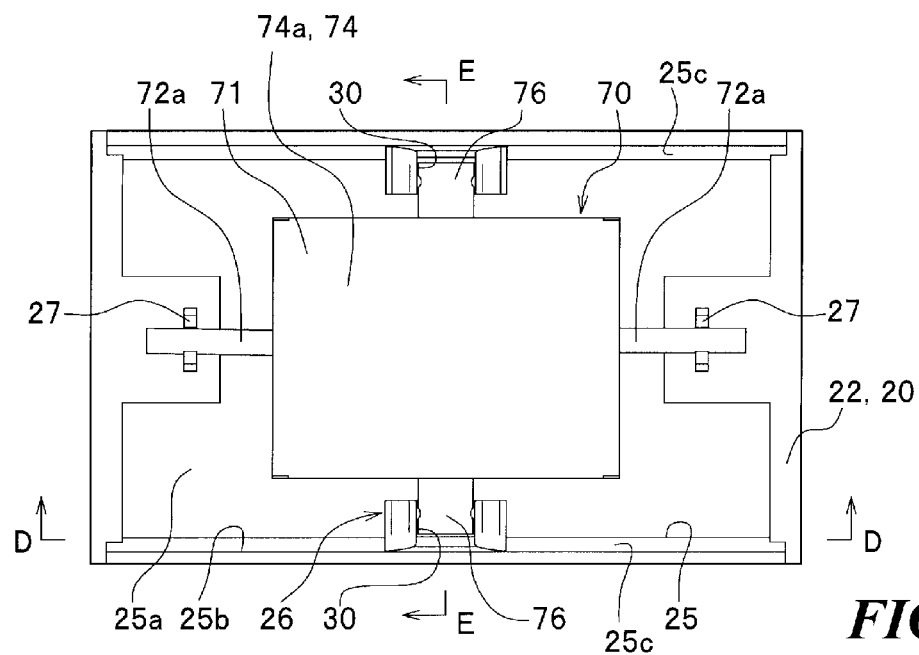
FIGS. 7A and 7B show an accommodating portion and a normal mode choke coil according to a second embodiment.

In the housing 20 according to the second embodiment, as shown in FIG. 7A, in four side surfaces of an accommodating portion 25, two side surfaces which face side surfaces of the case 74 are support surfaces 25c, 25c, and support portions 26, 26 are provided respectively on the support surfaces 25c, 25c so as to project therefrom.

The support portion 26 of the second embodiment has the same shape as that of the support portion 26 (refer to FIG. 4B) of the accommodating portion 25 according to the first embodiment, as shown in FIG. 7B. Namely, a support groove 30 is formed in the support portion 26, and the engaging portion 76 is inserted into the support groove 30.

The support groove 30 is formed by continuously connecting a first guide groove 32, a second guide groove 33 and a holding groove 34 in an up-to-down direction. Widths of an opening portion 31, the first guide groove 32, the second guide groove 33 and the holding groove 34 reduce gradually from the opening portion 31 towards the holding groove 34.

In the electronic control unit according to the second embodiment which is configured as described above, as shown in FIG. 7B, the engaging portions 76 of the normal mode choke coil 70 are in engagement with the support portions 26 in the accommodating portion 25 of the housing 20. As a result, the core member 71 is supported in the housing 20.

Consequently, in the vehicle brake fluid pressure control system which utilizes the electronic control unit of the second embodiment, even when the housing 20 vibrates excessively due to the vibration of the vehicle, the normal mode choke coil 70 can be held to the housing 20 in a stable fashion.

The width of the support groove 30 reduces gradually from the opening portion 31 towards a bottom surface 34c of the holding groove 34. This allows the engaging portions 76 to be guided smoothly into the corresponding holding grooves 34 when the engaging portions 76 are inserted into the support grooves 30, thereby enhancing the assembling performance in bringing the engaging portions 76 into engagement with the corresponding support portions 26.

Abutment portions 76a are provided on each side surface of the engaging portion 76 so as to be aligned in an up-to-down direction thereof, and a pressing force generated as a result of the side surfaces of the engaging portion 76 being brought into contact with inner surfaces of the holding groove 34 is scattered to the abutment portions 76a, this enabling the engaging portion 76 to be press-fitted smoothly in the holding groove 34.

The two abutment portions 76a, 76a which are provided on each side surface of the engaging portion 76 so as to be aligned in the extending direction (the up-to-down direction) of the holding groove 34 are brought into contact with the inner surfaces of the support groove 30, and this can prevent the inclination of the engaging portion 76 within the support groove 30, thereby holding the engaging portion 76 to the support portion 26 in a stable fashion.

While the second embodiment has been described heretofore, the invention is not limited to the second embodiment, and as with the first embodiment, it can be modified as required without departing from the spirit and scope thereof.

The invention claimed is:

1. An electronic control unit including:
a housing including an accommodating portion, the accommodating portion including a support portion; and
a noise filter including an engaging portion, at least part of the noise filter being housed in the accommodating portion of the housing in a state where the engaging portion is in engagement with the support portion,
wherein an inner surface of the accommodating portion includes two support surfaces which respectively face two axial end faces of a core member of the noise filter,
wherein the support portion includes two support portions and the two support portions are respectively formed on the two support surfaces, and
wherein, in the accommodating portion, a space between the two support surfaces reduces gradually from a side of an opening portion of the accomodating portion towards a side of a bottom portion of the accomodating portion.

2. The electronic control unit of claim 1,
wherein the core member is accommodated in the accommodating portion,
wherein a connection terminal is formed in the housing so as to project therefrom, and a conductor of the noise filter is attached to the connection terminal,
wherein the engaging portion projects from one of the two axial end faces of the core member, and
wherein the support portion includes a support groove, and the engaging portion is inserted into the support groove.

3. The electronic control unit of claim 2,
wherein the engaging portion includes two engaging portions, the two engaging portions project from the two axial end faces of the core member, and
wherein the accommodating portion includes the two support portions, and the two engaging portions are brought respectively into engagement with the two support portions.

4. The electronic control unit of claim 1,
wherein the two support portions include a support groove formed into a straight line from a lower end portion to an upper end portion of the support portion so as to extend vertical relative to a bottom surface of the accommodating portion.

5. The electronic control unit of claim 2,
wherein the engaging portion is press-fitted in the support groove.

6. The electronic control unit of claim 5,
wherein the engaging portion includes plural abutment portions to be brought into abutment with an inner surface of the support groove, and the plural abutment portions are aligned in an extending direction of the support groove.

7. The electronic control unit of claim 1,
wherein the support portion includes a support groove, and the engaging portion is inserted into the support groove.

8. The electronic control unit of claim 2,
wherein a gap is formed between the engaging portion and a bottom surface of the support groove.

9. The electronic control unit of claim 1,
wherein the noise filter is a common mode choke coil.

10. The electronic control unit of claim 1,
wherein the noise filter is a normal mode choke coil.

11. An electronic control unit including:
a housing including an accommodating portion, the accommodating portion including a support portion; and
a noise filter including an engaging portion, at least part of the noise filter being housed in the accommodating portion of the housing in a state where the engaging portion is in engagement with the support portion,
wherein the noise filter includes a core member, and the core member is accommodated in the accommodating portion,
wherein a connection terminal is formed in the housing so as to project therefrom, and a conductor of the noise filter is attached to the connection terminal,
wherein the engaging portion projects from an axial end face of the core member, and
wherein the support portion includes a support groove, and the engaging portion is inserted into the support groove,
wherein the engaging portion is press-fitted in the support groove, and wherein the support groove includes:
- a first guide groove which is formed continuously from an opening portion of the support groove;
- a second guide groove which is formed continuously from the first guide groove; and
- a holding groove which is formed continuously from the second guide groove and in which the engaging portion is press-fitted, wherein a width of the first guide groove reduces gradually from a side of the opening portion to a side of the second guide groove, wherein a width of the second guide groove reduces gradually from a side of the first guide groove to a side of the holding groove, and wherein an inclined angle at which a side surface of the second guide groove is inclined relative to a side surface of the holding groove is smaller than an inclined angle at which a side surface of the first guide groove is inclined relative to the side surface of the holding groove.

12. An electronic control unit including:
- a housing including an accommodating portion, the accommodating portion including a support portion; and
- a noise filter being housed in the accommodating portion of the housing, wherein the support portion comprises two support portions, wherein each of the two support portions include; a first guide groove, a second guide groove and a holding groove formed in the support groove, the first guide groove is formed continuously from an opening portion at an upper end portion of the support groove, the second guide groove is formed continuously from the first guide groove, the holding groove is formed continuously from the second guide groove, and the support groove is formed such that a width thereof reduces gradually from the opening portion towards the holding groove.

13. The electronic control unit of claim 12,
wherein a bottom surface of the holding groove of each of the two support portions is formed into a shape of a semicircular lower half portion of a circle.

14. The electronic control unit of claim 12,
wherein for each of the two support portions: two left and right side surfaces of the first guide groove are formed so that a left-to-right width of the first guide groove reduces as the first guide groove extends from the opening portion towards the second guide groove, and
two left and right side surfaces of the second guide groove are formed so that a left-to-right width of the second guide groove reduces as the second guide groove extends from the first guide groove towards the holding groove.

15. The electronic control unit of claim 12,
wherein for each of the two support portions, a width of the holding groove is a same as a width of the second guide groove at a lower end portion thereof and remains constant along a full length thereof.

16. The electronic control unit of claim 12,
wherein a smallest space defined between holding portions on side surfaces of the holding groove is smaller than a greatest width of an engaging portion which is engaged with the support portion.

17. The electronic control unit of claim 16,
wherein the engaging portion is two engaging portions provided respectively at lower end portions of axial end faces of a core member inserted into the accommodating portion so as to project therefrom, and
wherein the two engaging portions engage with the two support portions within the accommodating portion of the housing.

18. The electronic control unit of claim 17,
wherein taken along a direction which is at right angles to a direction of an axis thereof, the engaging portion has a shape resulting from partially overlapping two upper and lower circles providing a constriction laterally at a substantially central portion in relation to a height direction thereof.

19. The electronic control unit of claim 18,
wherein the engaging portion has a groove portion extending along an axial direction of the engaging portion on an upper end portion thereof.

\* \* \* \* \*